United States Patent
Lee et al.

(10) Patent No.: US 12,132,000 B2
(45) Date of Patent: Oct. 29, 2024

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Shao-Kuan Lee, Kaohsiung (TW); Cheng-Chin Lee, Taipei (TW); Cherng-Shiaw Tsai, New Taipei (TW); Kuang-Wei Yang, Hsinchu (TW); Hsin-Yen Huang, New Taipei (TW); Hsiaokang Chang, Hsinchu (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 565 days.

(21) Appl. No.: 17/460,168

(22) Filed: Aug. 28, 2021

(65) Prior Publication Data

US 2023/0067886 A1 Mar. 2, 2023

(51) Int. Cl.
*H01L 23/532* (2006.01)
*H01L 21/768* (2006.01)
(Continued)

(52) U.S. Cl.
CPC .. *H01L 23/53276* (2013.01); *H01L 21/76834* (2013.01); *H01L 21/76837* (2013.01); *H01L 21/76852* (2013.01); *H01L 21/76897* (2013.01); *H01L 23/5226* (2013.01); *H01L 23/53295* (2013.01); *H01L 23/535* (2013.01);
(Continued)

(58) Field of Classification Search
CPC ......... H01L 23/53276; H01L 21/76834; H01L 21/76837; H01L 21/76852; H01L 21/76897; H01L 23/5226; H01L 23/53295; H01L 23/535; H01L 29/0665; H01L 29/0673; H01L 29/401; H01L 29/41733; H01L 29/42392; H01L 29/45; H01L 29/775; H01L 29/78618; H01L 29/78696
See application file for complete search history.

(56) References Cited

U.S. PATENT DOCUMENTS 8,647,978 B1 * 2/2014 Ott ...................... H01L 23/5329
257/781
9,105,490 B2 * 8/2015 Wang .................. H01L 29/7851
(Continued)

FOREIGN PATENT DOCUMENTS

CN 106952864 A * 7/2017
CN 113937088 A * 1/2022 ......... H01L 23/5226
WO WO-2018063281 A1 * 4/2018 ............. H01L 21/02

*Primary Examiner* — Earl N Taylor
(74) *Attorney, Agent, or Firm* — NZ CARR LAW OFFICE

(57) ABSTRACT

An interconnection structure, along with methods of forming such, are described. The structure includes a dielectric layer, a first conductive feature disposed in the dielectric layer, a second conductive feature disposed over the first conductive feature, a third conductive feature disposed adjacent the second conductive feature, a first dielectric material disposed between the second and third conductive features, a first one or more graphene layers disposed between the second conductive feature and the first dielectric material, and a second one or more graphene layers disposed between the third conductive feature and the first dielectric material.

20 Claims, 10 Drawing Sheets

(51) Int. Cl.
  *H01L 23/522* (2006.01)
  *H01L 23/535* (2006.01)
  *H01L 29/06* (2006.01)
  *H01L 29/40* (2006.01)
  *H01L 29/417* (2006.01)
  *H01L 29/423* (2006.01)
  *H01L 29/45* (2006.01)
  *H01L 29/775* (2006.01)
  *H01L 29/786* (2006.01)

(52) U.S. Cl.
  CPC ...... *H01L 29/0665* (2013.01); *H01L 29/0673* (2013.01); *H01L 29/401* (2013.01); *H01L 29/41733* (2013.01); *H01L 29/42392* (2013.01); *H01L 29/45* (2013.01); *H01L 29/775* (2013.01); *H01L 29/78618* (2013.01); *H01L 29/78696* (2013.01)

(56) References Cited

U.S. PATENT DOCUMENTS

| | | | | |
|---|---|---|---|---|
| 9,236,267 B2 * | 1/2016 | De | | H01L 21/3088 |
| 9,236,300 B2 * | 1/2016 | Liaw | | H10B 10/125 |
| 9,406,804 B2 * | 8/2016 | Huang | | H01L 29/7853 |
| 9,443,769 B2 * | 9/2016 | Wang | | H01L 29/7842 |
| 9,520,482 B1 * | 12/2016 | Chang | | H01L 21/823864 |
| 9,548,366 B1 * | 1/2017 | Ho | | H01L 21/823475 |
| 9,576,814 B2 * | 2/2017 | Wu | | H01L 21/30604 |
| 9,831,183 B2 * | 11/2017 | Lin | | H01L 23/485 |
| 9,859,386 B2 | 1/2018 | Ho et al. | | |
| 2013/0113102 A1 * | 5/2013 | Bao | | H01L 23/53238 |
| | | | | 977/734 |
| 2015/0041981 A1 * | 2/2015 | Bao | | H01L 21/76873 |
| | | | | 438/643 |
| 2015/0206842 A1 * | 7/2015 | Saito | | H01L 21/76849 |
| | | | | 257/746 |
| 2017/0229372 A1 * | 8/2017 | Lee | | H01L 23/5226 |
| 2018/0033734 A1 * | 2/2018 | Zhou | | H01L 21/76885 |
| 2019/0096801 A1 * | 3/2019 | Yang | | H01L 23/5226 |
| 2021/0066187 A1 * | 3/2021 | Lee | | H01L 21/76834 |
| 2022/0223465 A1 * | 7/2022 | Huang | | H01L 21/76885 |
| 2022/0270970 A1 * | 8/2022 | Chan | | H01L 23/53276 |
| 2022/0277995 A1 * | 9/2022 | Chu | | H01L 23/535 |
| 2022/0285268 A1 * | 9/2022 | Lee | | H01L 21/76877 |
| 2022/0319989 A1 * | 10/2022 | Li | | H01L 23/522 |
| 2022/0319990 A1 * | 10/2022 | Huang | | H01L 21/76831 |
| 2022/0359414 A1 * | 11/2022 | Li | | H01L 21/76837 |
| 2022/0415786 A1 * | 12/2022 | Cheng | | H01L 21/76849 |
| 2022/0415818 A1 * | 12/2022 | Naylor | | H01L 21/76883 |
| 2023/0061501 A1 * | 3/2023 | Lo | | H01L 23/5222 |
| 2023/0067027 A1 * | 3/2023 | Lee | | H01L 21/76802 |
| 2023/0067886 A1 * | 3/2023 | Lee | | H01L 29/775 |

* cited by examiner

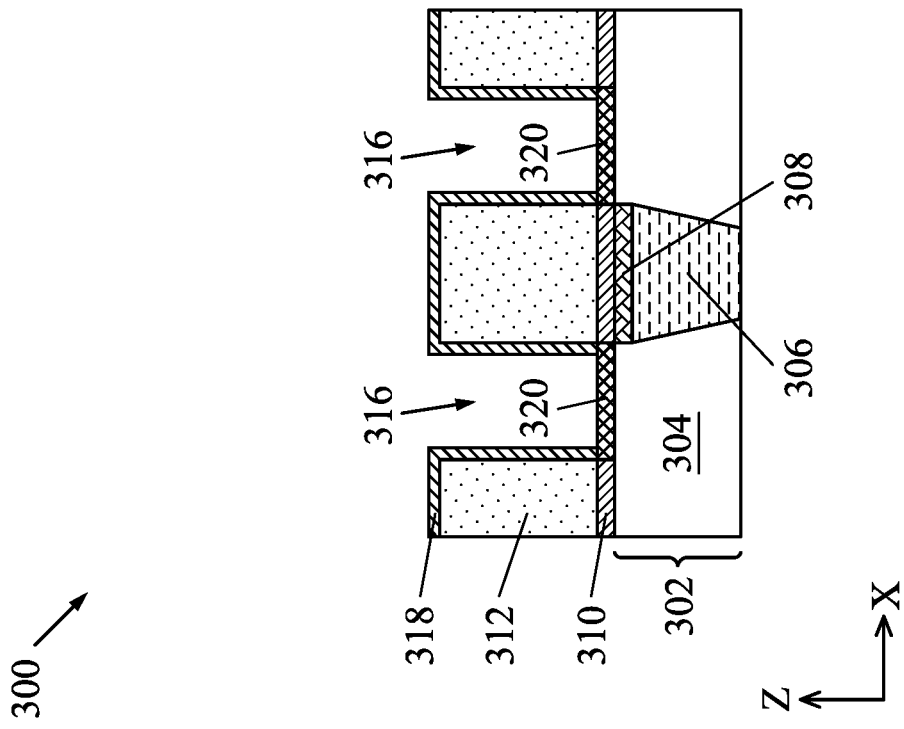
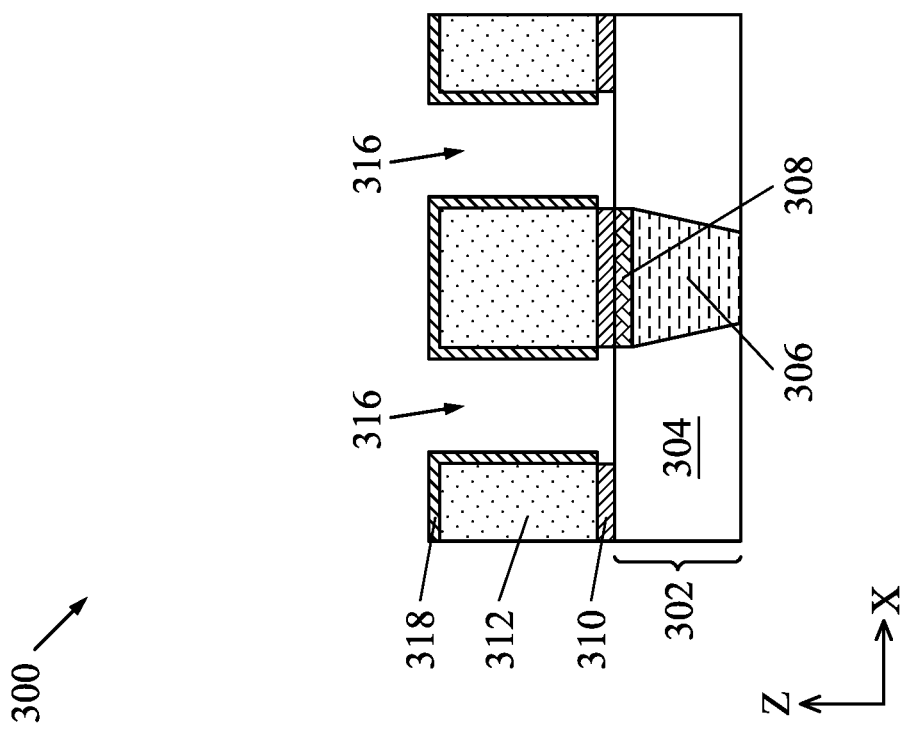

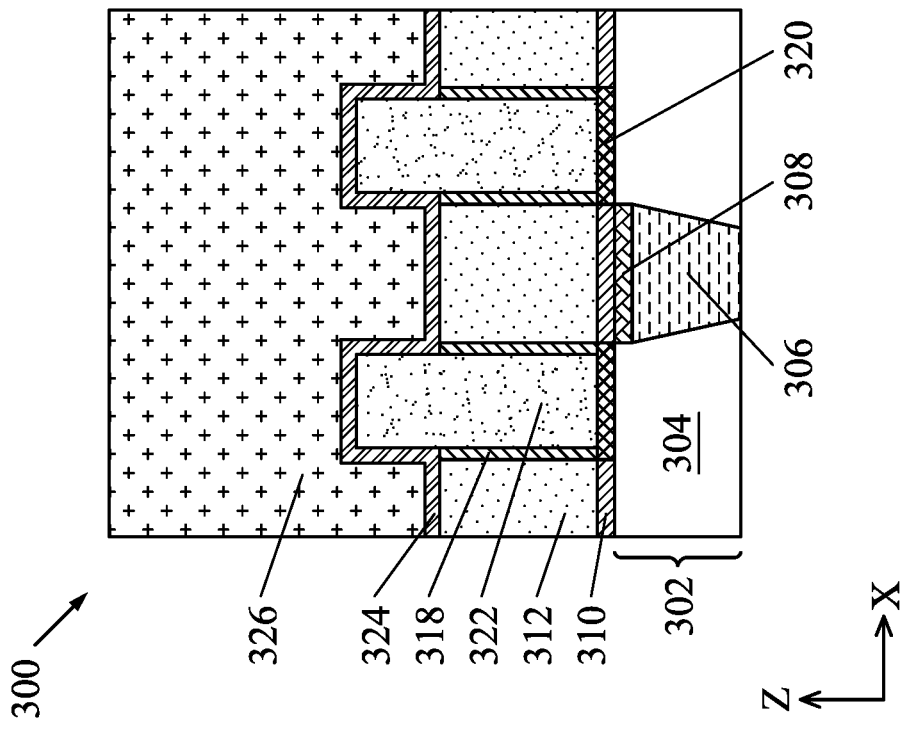
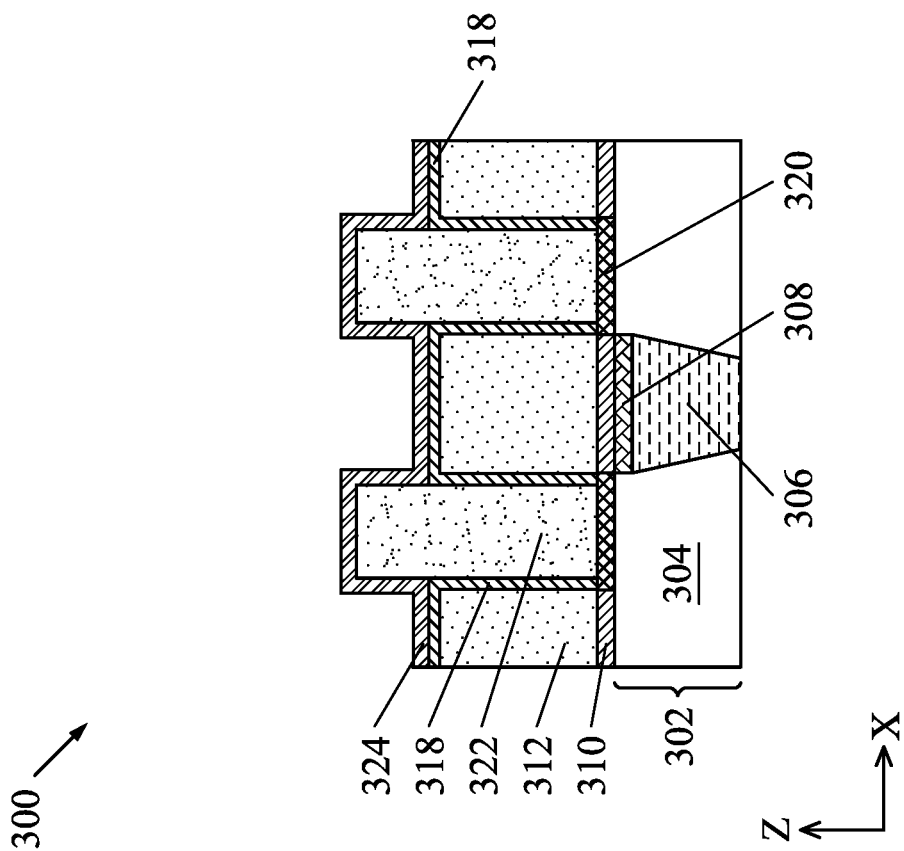
Fig. 2J
Fig. 2I

SEMICONDUCTOR DEVICE STRUCTURE AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. With decreasing semiconductor device dimensions, improved semiconductor devices with reduced capacitance coupling is needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
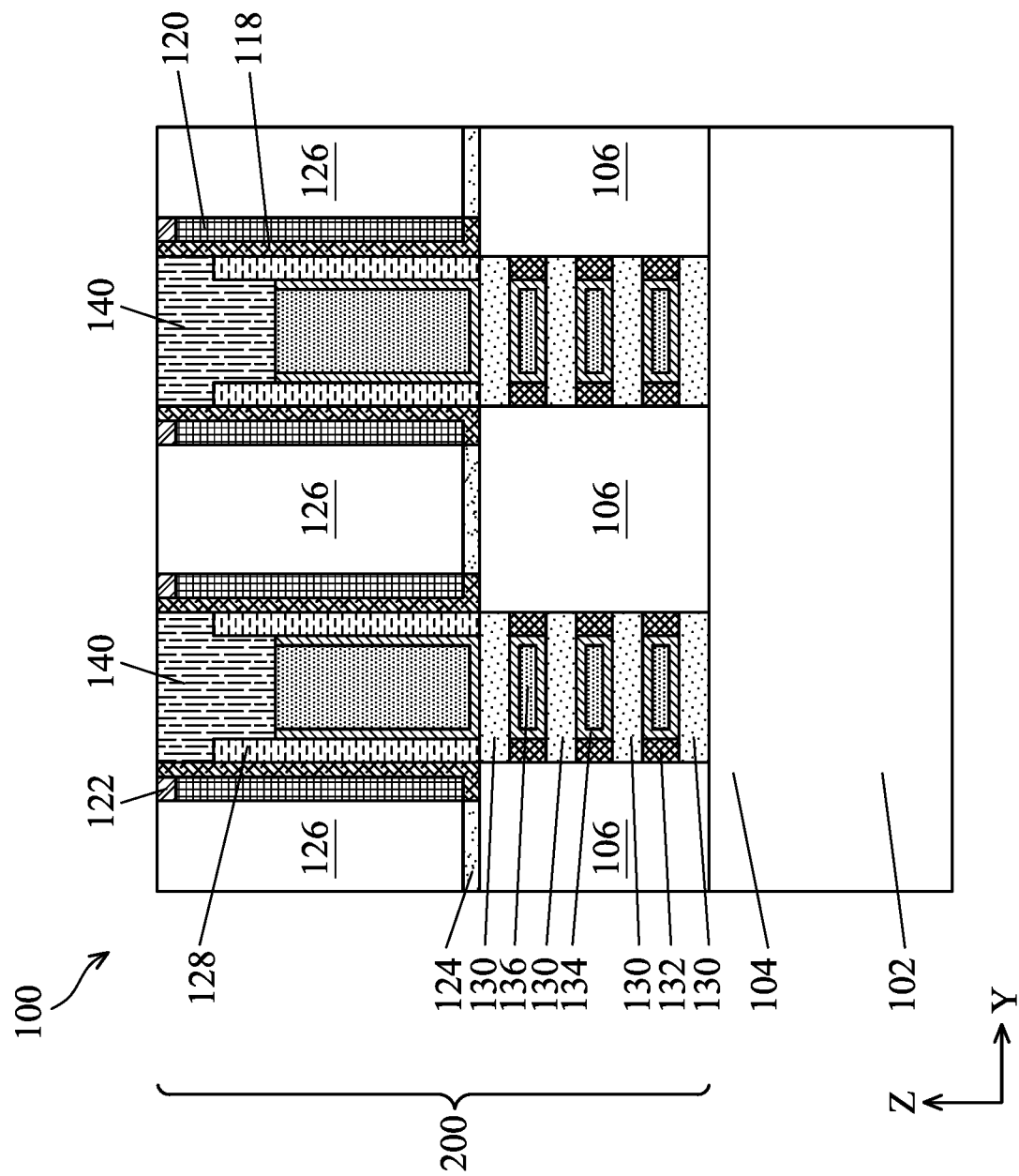
FIG. 1 is a cross-sectional side view of the stage of manufacturing the semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a stage of manufacturing a semiconductor device structure 100. As shown in FIG. 1, the semiconductor device structure 100 includes a substrate 102 having substrate portions 104 extending therefrom and source/drain (S/D) epitaxial features 106 disposed over the substrate portions 104. The substrate 102 may be a semiconductor substrate, such as a bulk silicon substrate. In some embodiments, the substrate 102 may be an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; other suitable materials; or combinations thereof. Possible substrates 102 also include a silicon-on-insulator (SOI) substrate. SOI substrates are fabricated using separation by implantation of oxygen (SIMOX), wafer bonding, and/or other suitable methods. The substrate portions 104 may be formed by recessing portions of the substrate 102. Thus, the substrate portions 104 may include the same material as the substrate 102. The substrate 102 and the substrate portions 104 may include various regions that have been suitably doped with impurities (e.g., p-type or n-type impurities). The dopants are, for example boron for a p-type field effect transistor (PFET) and phosphorus for an n-type field effect transistor (NFET). The S/D epitaxial features 106 may include a semiconductor material, such as Si or Ge, a III-V compound semiconductor, a II-VI compound semiconductor, or other suitable semiconductor material. Exemplary S/D epitaxial features 106 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D epitaxial features 106 may include p-type dopants, such as boron; n-type dopants, such as phosphorus or arsenic; and/or other suitable dopants including combinations thereof.

As shown in FIG. 1, S/D epitaxial features 106 may be connected by one or more semiconductor layers 130, which may be channels of a FET. In some embodiments, the FET is a nanostructure FET including a plurality of semiconductor layers 130, and at least a portion of each semiconductor layer 130 is wrapped around by a gate electrode layer 136. The semiconductor layer 130 may be or include materials such as Si, Ge, SiC, GeAs, GaP, InP, InAs, InSb, GaAsP, AlInAs, AlGaAs, InGaAs, GaInP, GaInAsP, or other suitable material. In some embodiments, each semiconductor layer 130 is made of Si. The gate electrode layer 136 includes one or more layers of electrically conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. In some embodiments, the gate electrode layer 136 includes a metal. A gate dielectric layer 134 may be disposed between the gate electrode layer 136 and the semiconductor layers 130. The gate dielectric layer 134 may include two or more layers, such as an interfacial layer and a high-k dielectric layer. In some embodiments, the interfacial layer is an oxide layer, and the high-k dielectric layer includes hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HMO), hafnium titanium oxide (HMO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), hafnium dioxide-alumina (HfO$_2$—Al$_2$O$_3$) alloy, or other suitable high-k materials.

The gate dielectric layer 134 and the gate electrode layer 136 may be separated from the S/D epitaxial features 106 by inner spacers 132. The inner spacers 132 may include a dielectric material, such as SiON, SiCN, SiOC, SiOCN, or SiN. Spacers 128 may be disposed over the plurality of semiconductor layers 130. The spacers 128 may include a dielectric material such as silicon oxide, silicon nitride, silicon carbide, silicon oxynitride, SiCN, silicon oxycarbide, SiOCN, and/or combinations thereof. In some embodiments, a self-aligned contact (SAC) layer 140 is formed over the spacers 128, the gate dielectric layer 134, and the gate electrode layer 136, as shown in FIG. 1. The SAC layer 140 may include any suitable material such as SiO, SiN, SiC, SiON, SiOC, SiCN, SiOCN, AlO, AlON, ZrO, ZrN, or combinations thereof.

A contact etch stop layer (CESL) 118 and an interlayer dielectric (ILD) layer 120 are disposed over the S/D epitaxial features 106, as shown in FIG. 1. The CESL 118 may include an oxygen-containing material or a nitrogen-containing material, such as silicon nitride, silicon carbon nitride, silicon oxynitride, carbon nitride, silicon oxide, silicon carbon oxide, the like, or a combination thereof. The materials for the ILD layer 120 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. A cap layer 122 may be disposed on the ILD layer 120, and the cap layer 122 may include a nitrogen-containing material, such as SiCN.

Conductive contacts 126 may be disposed in the ILD layer 120 and over the S/D epitaxial features 106, as shown in FIG. 1. The conductive contacts 126 may include one or more electrically conductive material, such as Ru, Mo, Co, Ni. W, Ti, Ta, Cu, Al, TiN and TaN. Silicide layers 124 may be disposed between the conductive contacts 126 and the S/D epitaxial features 106.

As shown in FIG. 1, the semiconductor device structure 100 may include the substrate 102 and a device layer 200 disposed over the substrate 102. The device layer 200 may include one or more devices, such as transistors, diodes, imaging sensors, resistors, capacitors, inductors, memory cells, combinations thereof, and/or other suitable devices. In some embodiments, the device layer 200 includes transistors, such as nanostructure transistor having a plurality of channels wrapped around by the gate electrode layer, as described above. The term nanostructure is used herein to designate any material portion with nanoscale, or even microscale dimensions, and having any suitable shape, such as an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The channel(s) of the semiconductor device structure 100 may be surrounded by the gate electrode layer. The nanostructure transistors may be referred to as nanosheet transistors, nanowire transistors, gate-all-around (GAA) transistors, multi-bridge channel (MBC) transistors, or any transistors having the gate electrode layer surrounding the channels. In some embodiments, the device layer 200 includes planar FET, FinFET, complementary FET (CFET), forksheet FET, or other suitable devices.

Figure 2B:
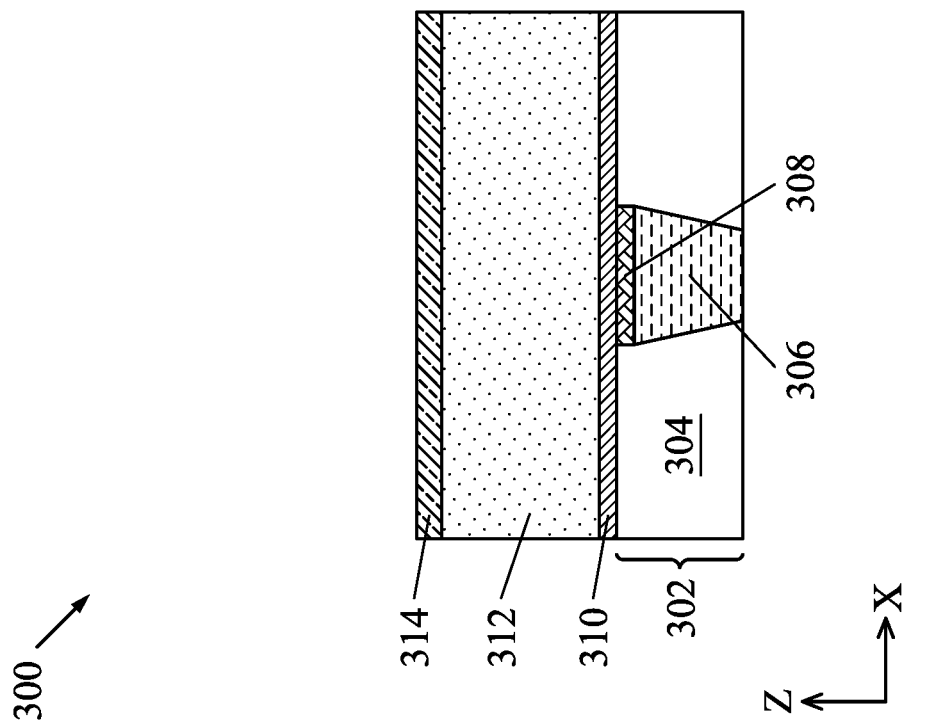
FIGS. 2A-2P are cross-sectional side views of various stages of manufacturing an interconnection structure, in accordance with some embodiments.
Figure 2A:
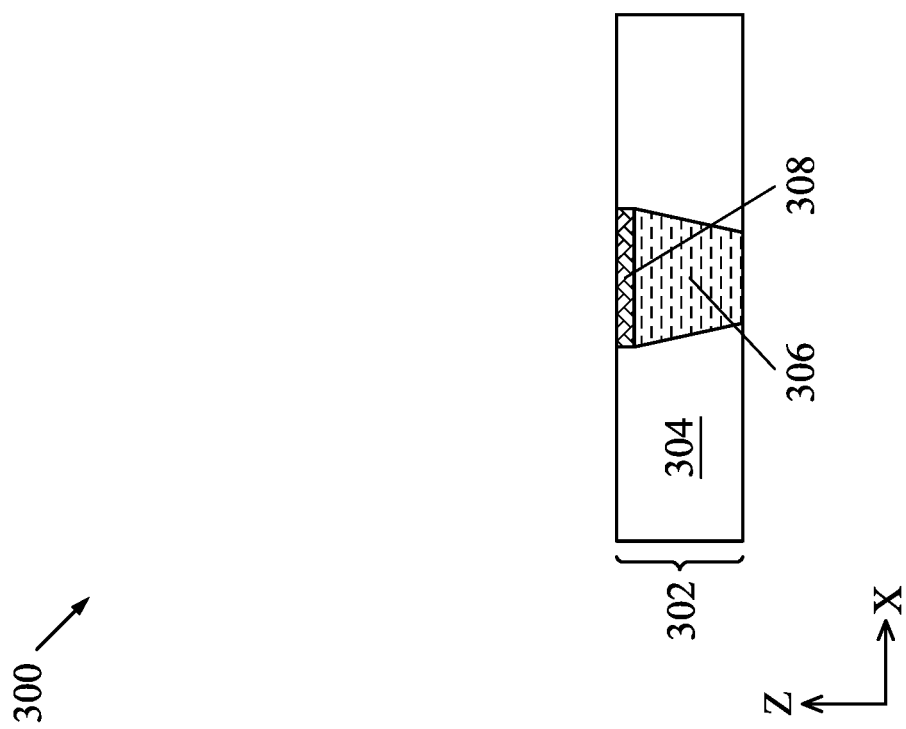
Figure 2C:
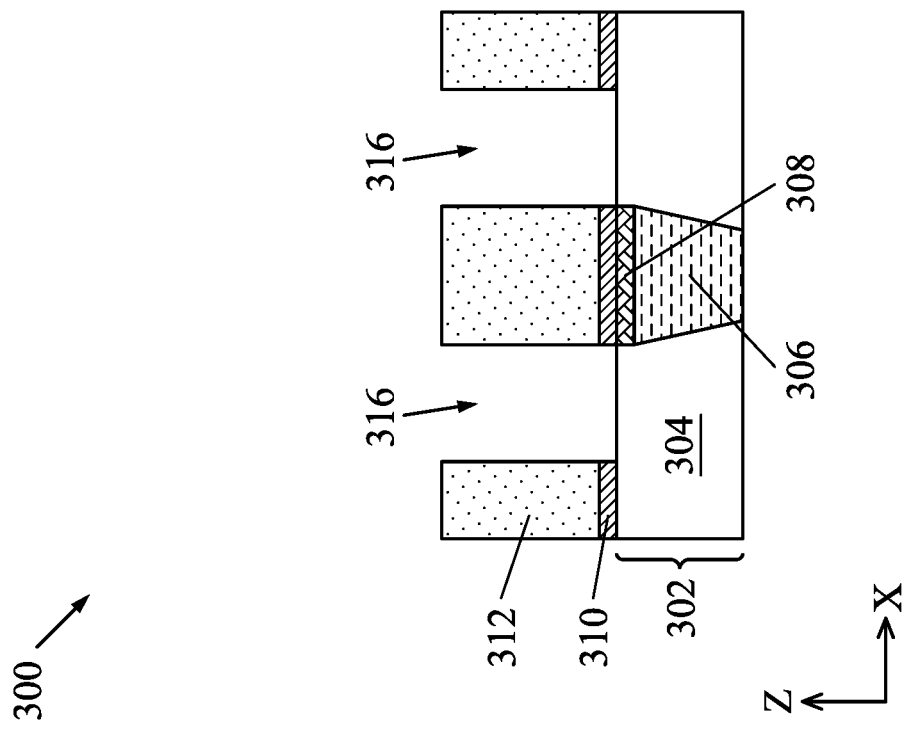
Figure 2D:
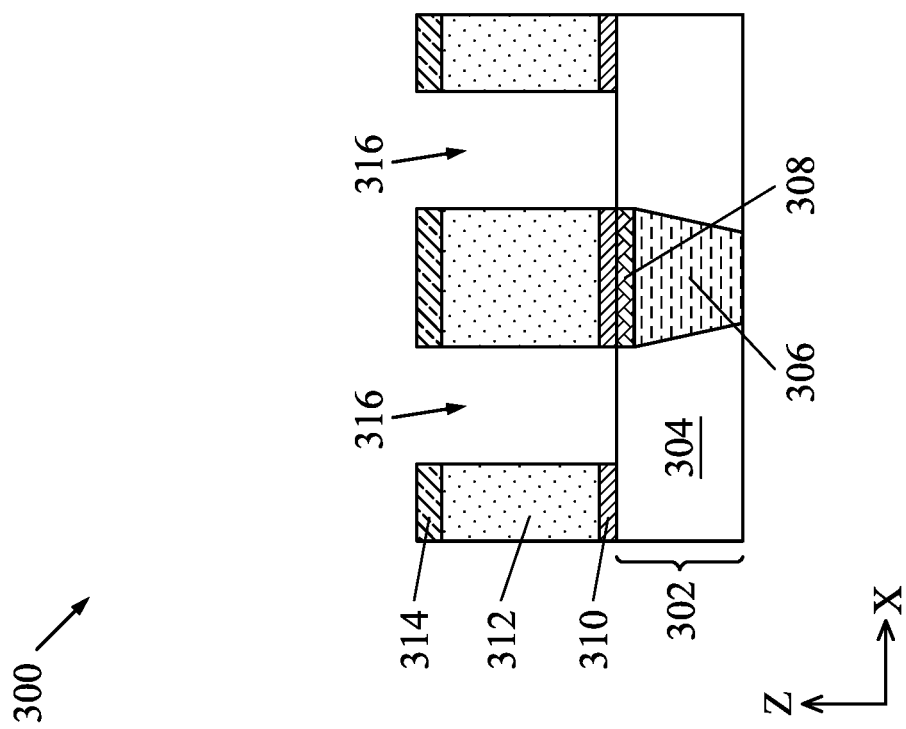
Figure 2H:
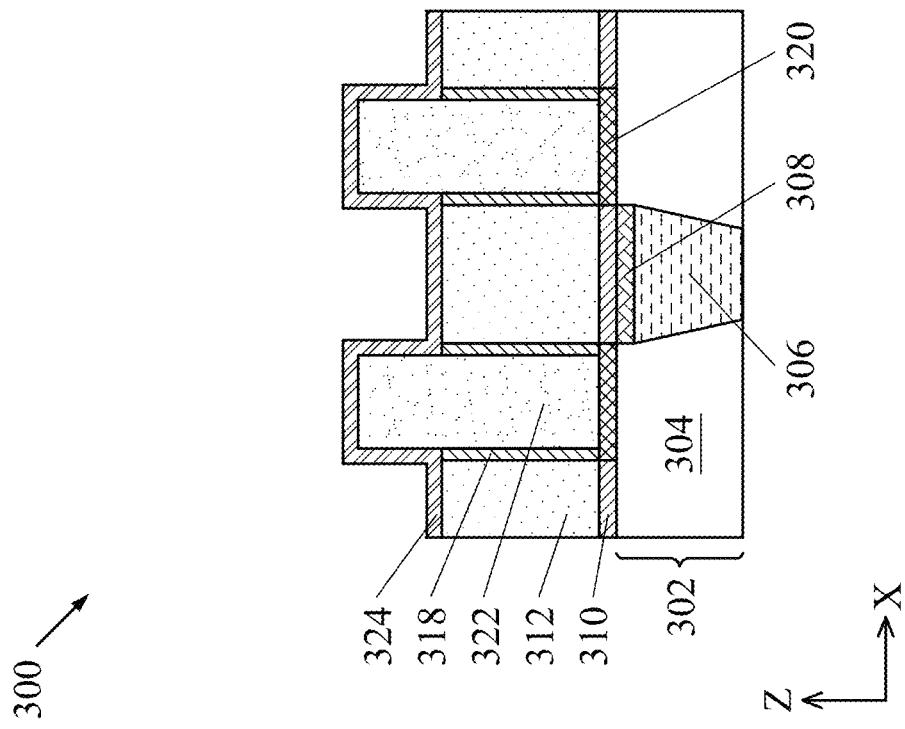
Figure 2G:
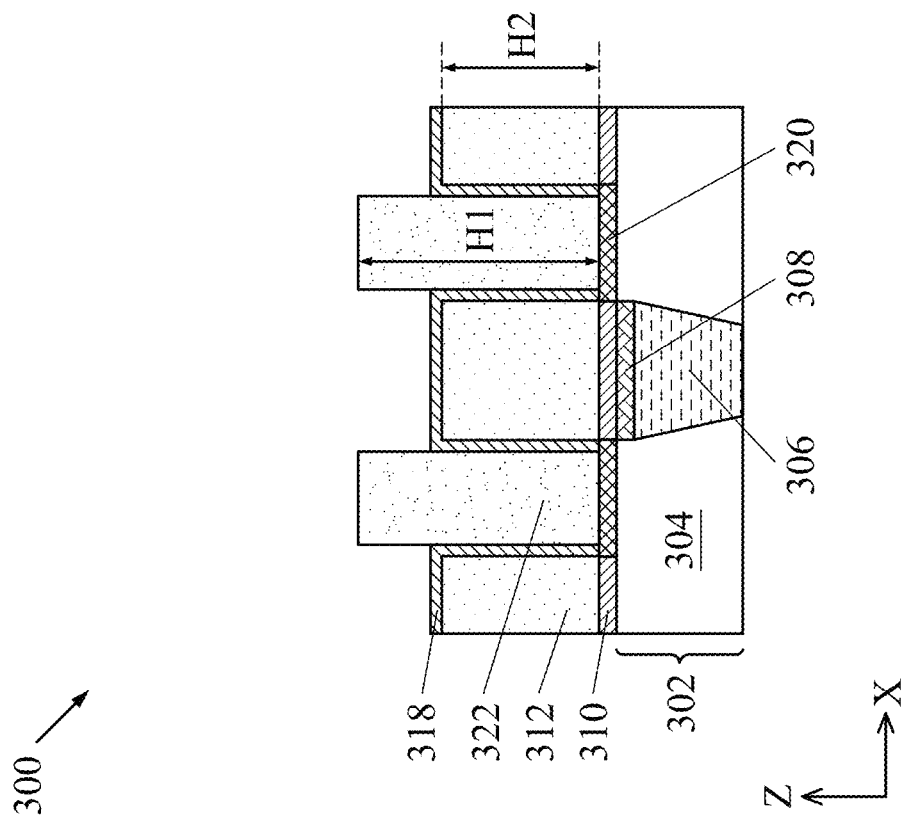
Figure 2L:
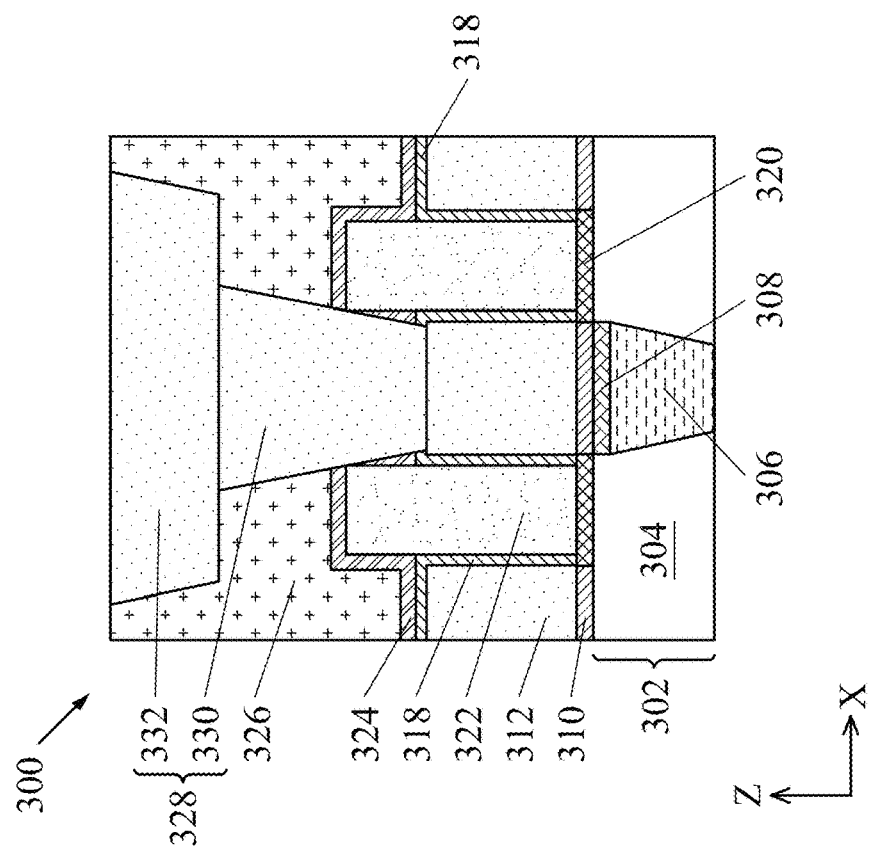
Figure 2K:
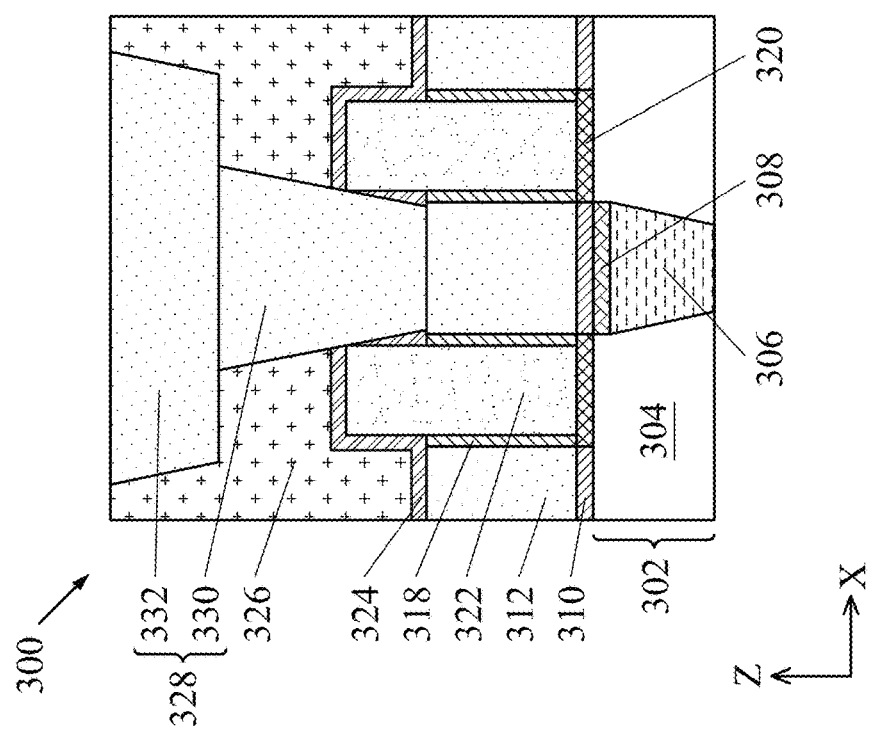
Figure 2N:
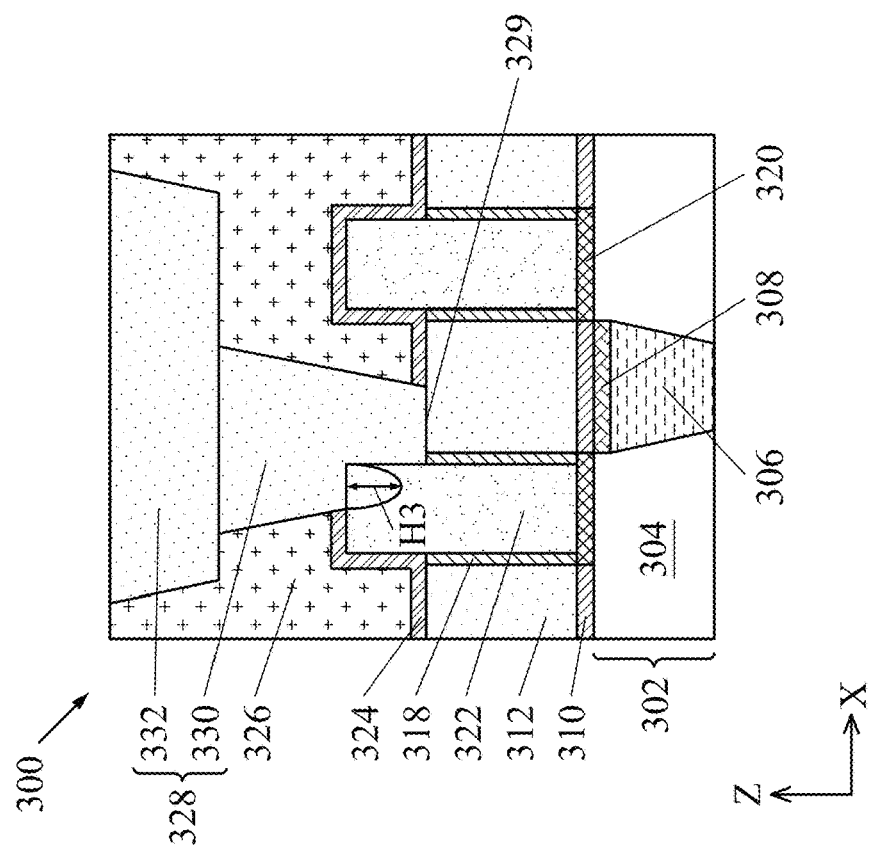
Figure 2M:
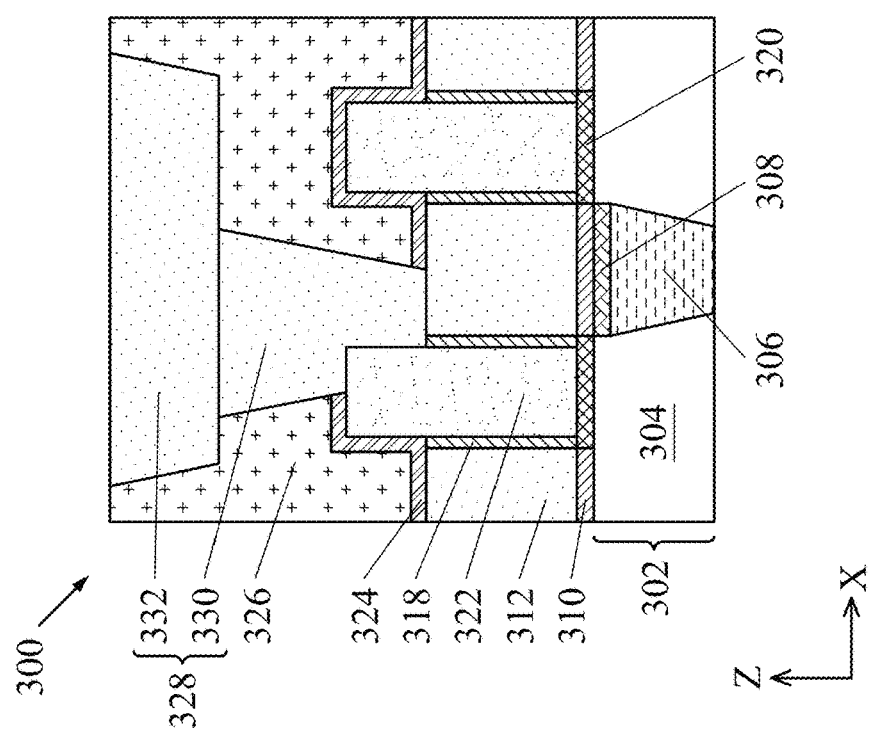
Figure 2P:
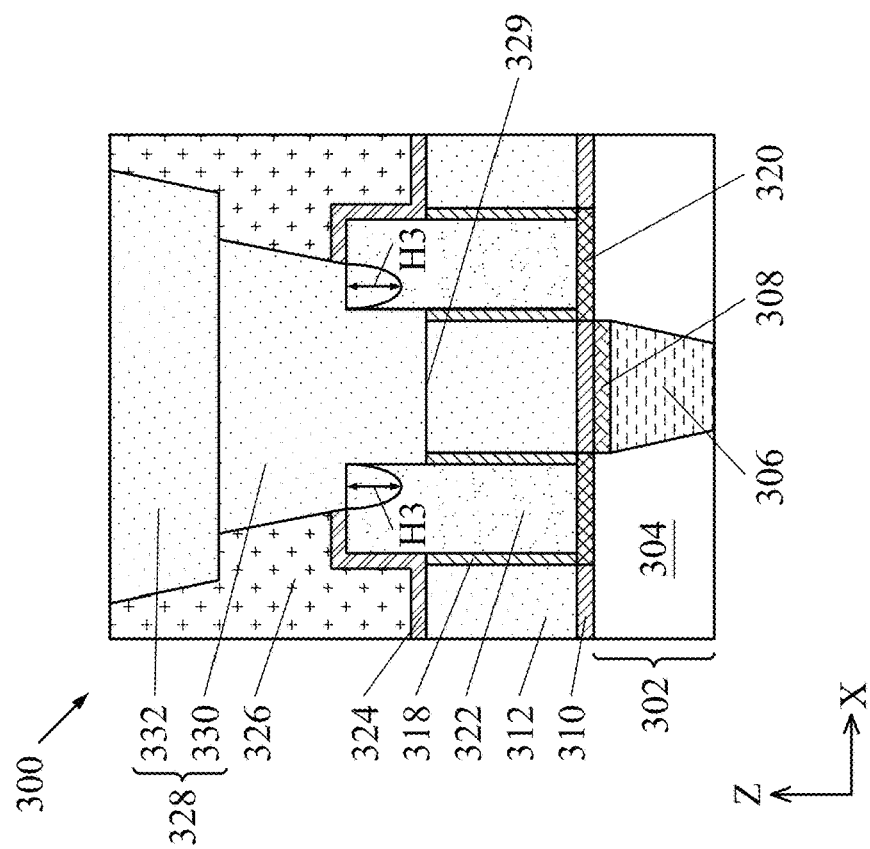

FIGS. 2A-2P are cross-sectional side views of various stages of manufacturing an interconnection structure 300, in accordance with some embodiments. As shown in FIG. 2A, the interconnection structure 300 includes a layer 302, which may be an ILD layer or an intermetal dielectric (IMD) layer. In some embodiments, the layer 302 may be disposed over the ILD layer 120 (FIG. 1). In some embodiments, the layer 302 may be disposed on the cap layer 122 and the conductive contacts 126. The layer 302 includes a dielectric layer 304, one or more conductive features 306 (only one is shown) disposed in the dielectric layer 304, and an optional cap layer 308 disposed on each conductive feature 306. The dielectric layer 304 may include an oxygen-containing material, such as silicon oxide or fluorine-doped silicate glass (FSG); a nitrogen-containing material, such as silicon nitride, silicon oxynitride (SiON), SiOCN, SiCN; a low-k dielectric material (e.g., a material having a k value lower than that of the silicon oxide); or any suitable dielectric material. In some embodiments, the dielectric layer 304 includes silicon oxide. The dielectric layer 304 may be formed by chemical vapor deposition (CVD), atomic layer deposition (ALD), spin coating, or other suitable process. The conductive feature 306 and the cap layer 308 may each include an electrically conductive material, such as Cu, Co, Ru, Mo, Cr, W, Mn, Rh, Ir, Ni, Pd, Pt, Ag, Au, Al, alloys thereof, or other suitable material. In some embodiments, the conductive feature 306 and the cap layer 308 each includes a metal. The conductive feature 306 may be formed by physical vapor deposition (PVD), CVD, ALD, or other suitable process. The cap layer 308 may be formed by PVD, CVD, ALD, or other suitable process. In some embodiments, the conductive feature 306 has a thickness ranging from about 50 Angstroms to about 500 Angstroms, and the cap layer 308 has a thickness ranging from about 2 Angstroms to about 50 Angstroms. The conductive features 306 may be electrically connected to corresponding conductive contacts 126 (FIG. 1).

As shown in FIG. 2B, a glue layer 310, a conductive layer 312, and a hard mask 314 are formed over the layer 302. In some embodiment, the glue layer 310 is formed on the layer 302, the conductive layer 312 is formed on the glue layer 310, and the hard mask 314 is formed on the conductive layer 312. In some embodiments, the glue layer 310 is not present, and the conductive layer 312 is formed on the layer 302. The glue layer 310 may include a nitride, such as a metal nitride, and may be formed by PVD, CVD, ALD, or other suitable process. In some embodiments, the glue layer 310 includes TiN or TaN. The glue layer 310 may have a thickness ranging from about 2 Angstroms to about 100 Angstroms. The glue layer 310 may provide adhesion between the conductive layer 312 and the cap layer 308 or the conductive feature 306. The conductive layer 312 may include the same material as the conductive feature 306 and may be formed by the same process as the conductive feature 306. The conductive layer 312 may have the same thickness as the conductive feature 306. The hard mask 314 may include SiN, SiON, SiO$_2$, the like, or a combination thereof, and may be formed by CVD, PVD, ALD, spin coating, or other suitable process.

As shown in FIG. 2C, openings 316 are formed in the hard mask 314, the conductive layer 312, and the glue layer 310. Openings 316 may be formed by first patterning the hard mask 314, followed by transferring the pattern of the hard mask 314 to the conductive layer 312 and the glue layer 310. The openings 316 may be formed by any suitable process, such as wet etch, dry etch, or a combination thereof. In some embodiments, the openings 316 are formed by one or more etch processes. The openings 316 separates the conductive layer 312 into two or more conductive portions. In some embodiments, each portion of the conductive layer 312 may be a conductive feature, such as a conductive line. For example, the conductive layer 312 includes one or more conductive features, such as a plurality of conductive features. Each opening 316 exposes a portion of the dielectric layer 304. As shown in FIG. 2D, the hard mask 314 is removed. The hard mask 314 may be removed by any suitable process, such as a dry etch, a wet etch, or a combination thereof. In some embodiments, the hard mask 314 is removed by a selective etch process that removes the hard mask 314 but not the conductive layer 312 and the dielectric layer 304.

As shown in FIG. 2E, one or more graphene layers 318 are formed on the exposed surfaces of each portion of the conductive layer 312. The one or more graphene layers 318 may be selectively formed on the metallic surfaces of the portions of the conductive layer 312 but not on the exposed surfaces of the glue layer 310 and the dielectric layer 304. For example, the one or more graphene layers 318 are formed on the exposed horizontal and vertical surfaces of the portions of the conductive layer 312. In some embodiments, the one or more graphene layers 318 may include 1 to 10 layers of graphene and have a total thickness ranging from about 3 Angstroms to about 35 Angstroms. The one or more graphene layers 318 may prevent a catalyst layer 320 (FIG. 2F) from forming thereon. Thus, if the number of the graphene layer 318 is less than 1, which means no graphene layer 318, the catalyst layer 320 may be formed on the exposed portions of the conductive layer 312. On the other hand, if the number of the graphene layers 318 is greater than 10, manufacturing cost may be increased without significant advantage. The one or more graphene layers 318 may be formed by any suitable process, such as CVD. In one embodiment where a CVD process is used, the one or more graphene layers 318 are formed by exposing the exposed surfaces of the portions of the conductive layer 312 to a carbon-containing precursor and other precursor(s), such as hydrogen ($H_2$) and/or argon. The formation of the one or more graphene layers 318 is a metal-catalyzed process. Therefore, the metallic surfaces of the portions of the conductive layer 312 promote selective growth of the one or more graphene layers 318 thereon, with little or no graphene layers 318 grown on the dielectric surfaces of the glue layer 310 and the dielectric layer 304. Suitable carbon-containing precursors may include, but are not limited to, methane, ethane, ethylene, or any suitable hydrocarbon gas. The selective growth of the one or more graphene layers 318 may be performed at a temperature ranging from about 200 degree Celsius to about 1200 degree Celsius, and a pressure ranging from about 0.25 Torr to about 22800 Torr.

As shown in FIG. 2F, a catalyst layer 320 is formed on the exposed surface of the dielectric layer 304 in each opening 316. In some embodiments, the one or more graphene layers 318 prevent the catalyst layer 320 from forming thereon. For example, at least one of the precursors used to form the catalyst layer 320 may be water vapor, and the surfaces of the one or more graphene layers 318 are hydrophobic. Thus, the catalyst layer 320 does not substantially form on the hydrophobic surface of the one or more graphene layers 318. Therefore, without the one or more graphene layers 318, the catalyst layer 320 may be formed on the exposed surfaces of the portions of the conductive layer 312. In some embodiments, the catalyst layer 320 is in contact with the glue layer 310. The catalyst layer 320 may be an aluminum-containing material, such as aluminum oxide ($Al_xO_y$), where x and y are integers, such as 1, 2, 3, 4, or 5. In some embodiments, the aluminum-containing material of the catalyst layer 320 is non-stoichiometric, and x and y may not be integers. The catalyst layer 320 provides active sites for the subsequent formation of a dielectric material 322 (FIG. 2G) in each opening 316. With the one or more graphene layers 318 covering the exposed surfaces of the portions of the conductive layer 312, the catalyst layer 320 is not formed on the one or more graphene layers 318. Thus, the dielectric material 322 (FIG. 2G) does not form on the one or more graphene layers 318.

As shown in FIG. 2G, the dielectric material 322 is formed on the catalyst layer 320 in each opening 316 (FIG. 2F). The dielectric material 322 may be $SiO_x$, where x is integers or non-integers. In some embodiments, the dielectric material 322 is $SiO_2$. In some embodiments, the dielectric material 322 may be a dielectric material having a k value ranging from about 2 to about 3.9. The dielectric material 322 may be formed bottom-up. For example, the dielectric material 322 is grown from the catalyst layer 320 and is not formed on the one or more graphene layers 318 formed on the horizontal surfaces of the portions of the conductive layer 312. The one or more graphene layers 318 formed on the vertical surfaces of the portions of the conductive layer 312 may be covered by the dielectric material 322 as the dielectric material 322 grows upward from the catalyst layer 320 in each opening 316. In some embodiments, the dielectric material 322 is formed by a thermal process with precursor soaking. For example, one or more precursors, such as silicon-containing precursor and oxygen-containing precursor, may react on the active sites provided by the catalyst layer 320 to form the dielectric material 322. The catalyst layer 320 may provide active sites for bottom-up growth of the dielectric material 322 having a height H1 up to 15 nm. In some embodiments, in order for the dielectric material 322 to have a height H1 greater than about 15 nm, another catalyst layer 320 may be formed on the dielectric material 322, and another dielectric material 322 may be grown from the newly formed catalyst layer 320. The height H1 may include two dielectric materials 322 with the catalyst layer 320 formed therebetween.

As shown in FIG. 2G, each dielectric material 322 may have the height H1 and each portion of the conductive layer 312 may have a height H2. The height H1 is greater than the height H2 by at least 2 nm, such as 2 nm to 10 nm. In other words, the difference between the height H1 and the height H2 is about 2 nm to about 10 nm. The dielectric material 322 may prevent a conductive feature (328 FIG. 2N) formed subsequently from entering between the neighboring portions of the conductive layer 312 as a result of an edge placement error (EPE). Thus, if the difference between the height H1 and the height H2 is less than about 2 nm, the dielectric material 322 may not be sufficient to prevent the conductive feature 328 (FIG. 2N) from entering between the neighboring portions of the conductive layer 312. On the other hand, if the difference between the height H1 and the height H2 is greater than about 10 nm, manufacturing cost is increased without significant advantage.

After forming the dielectric material 322, an optional plasma treatment may be performed to remove the exposed one or more graphene layers 318. In some embodiments, the one or more graphene layers 318 formed on the horizontal surfaces of the portions of the conductive layer 312 are removed by the plasma treatment, and the horizontal surfaces of the portions of the conductive layer 312 are exposed. The plasma treatment may utilize process gases such as hydrogen-containing gas, such as hydrogen gas; nitrogen-containing gas, such as nitrogen gas or ammonia; oxygen-containing gas, such as oxygen gas, carbon monoxide, or carbon dioxide; or other suitable process gas. The plasma may be in-situ or remote. The plasma treatment may remove the exposed one or more graphene layers 318 but not the dielectric material 322 or the conductive layer 312. The remaining one or more graphene layers 318 are disposed on the vertical surfaces of the portions of the conductive layer 312 and between the portion of the conductive layer 312 and the dielectric material 322. In other words, each portion of the conductive layer 312 is separated from the dielectric material 322 by the one or more graphene layers 318.

As shown in FIG. 2H, an etch stop layer 324 is formed on the exposed surfaces of the portions of the conductive layer 312 and the dielectric material 322, in the embodiment that the one or more graphene layers 318 formed on the horizontal surfaces of the portions of the conductive layer 312 are removed. The etch stop layer 324 may be made of a material having different etch selectivity compared to the dielectric material 322. In some embodiments, the etch stop layer 324 is made of a material including a metal, such as a metal oxide, metal nitride, or metal carbide. For example, the etch stop layer 324 is a metal oxide and may include Al, Hf, Zr, Y, or other suitable metal. In some embodiments, the etch stop layer 324 is made of aluminum oxide or aluminum nitride. The etch stop layer 324 may be formed by any suitable process, such as CVD, ALD, or spin-on.

In some embodiments, as shown in FIG. 2I, the one or more graphene layers 318 formed on the horizontal surfaces of the portions of the conductive layer 312 are not removed, and the etch stop layer 324 is formed on the one or more graphene layers 318 and the dielectric material 322.

As shown in FIG. 2J, a dielectric material 326 is formed on the etch stop layer 324. The dielectric material 326 may include a low-k dielectric material, such as a low-k dielectric material including Si, O, C, H, or combinations thereof. The dielectric material 326 may be formed by any suitable process, such as CVD, ALD, or spin-on. An optional etch stop layer (not shown) may be embedded in the dielectric material 326. As shown in FIG. 2K, a conductive feature 328 is formed in the dielectric material 326. The conductive feature 328 may include a first portion 330 disposed in a first opening in the dielectric material 326 and a second portion 332 disposed in a second opening located above the first opening. The first and second openings may be a result of a dual-damascene process. For example, the second opening may be first formed by patterning a hard mask (not shown) disposed on the dielectric material 326 and transferring the pattern to a portion of the dielectric material 326. The optional etch stop layer (not shown) embedded in the dielectric material 326 may be utilized in forming the second opening. The first opening is then formed by covering a portion of a bottom of the second opening. Thus, the first opening has smaller dimensions than the second opening. In some embodiments, the first opening is formed before the second opening. In some embodiments, the first opening is a via and the second opening is a trench. The first and second openings in the dielectric material 326 may be formed by any suitable processes, such as one or more etch processes. The etch processes also remove a portion of the etch stop layer 324, so the first opening exposes a top surface of a portion of the conductive layer 312.

In some embodiments, the optional plasma treatment to remove the one or more graphene layers 318 formed on horizontal surfaces of the portions of the conductive layer 312 is not performed, and a portion of the one or more graphene layers 318 may be exposed by the first opening. In some embodiments, a plasma treatment may be performed after forming the first opening in the dielectric material 326 to remove the exposed portion of the one or more graphene layers 318 and to expose the horizontal surface of a portion of the conductive layer 312, so the first portion 330 of the conductive feature 328 is formed on the exposed horizontal surface of the portion of the conductive layer 312, as shown in FIG. 2L. The plasma treatment does not substantially affect the dielectric material 326. In some embodiments, the portion of the one or more graphene layers 318 is not removed, and the first portion 330 of the conductive feature 328 is formed on the one or more graphene layers 318. With the one or more graphene layers 318 formed on at least the vertical surfaces and in some embodiments, on at least some or all of the horizonal surfaces of the portions of the conductive layer 312, sheet resistance is reduced. Thus, the one or more graphene layers 318 not only block the deposition of the catalyst layer 320, but also help reducing sheet resistance.

In some embodiments, a barrier layer (not shown) may be formed in the first and second openings before forming the conductive feature 328. The barrier layer may include Co, W, Ru, Al, Mo, Ti, TiN, TiSi, CoSi, NiSi, Cu, TaN, Ni, or TiSiNi and may be formed by any suitable process, such as PVD, ALD, or PECVD. In some embodiments, the barrier layer may be a conformal layer formed by a conformal process, such as ALD. The conductive feature 328 may include an electrically conductive material, such as a metal. For example, the conductive feature 328 includes Cu, Ni, Co, Ru, Ir, Al, Pt, Pd, Au, Ag, Os, W, Mo, alloys thereof, or other suitable material. The conductive feature 328 may be formed by any suitable process, such as electro-chemical plating (ECP), PVD, CVD, or PECVD. In some embodiments, the first portion 330 of the conductive feature 328 may be a conductive via, and the second portion 332 of the conductive feature 328 may be a conductive line.

In some embodiments, the first portion 330 of the conductive feature 328 may be disposed over a portion of the conductive layer 312 (i.e., a conductive feature) and between two dielectric materials 322, as shown in FIG. 2K. The first portion 330 being aligned with a portion of the conductive layer 312 is a result of having the first opening being aligned with the portion of the conductive layer 312. In some embodiments, the first opening is slightly misaligned with the portion of the conductive layer 312 as a result of EPE, and a portion of the dielectric material 322 is exposed, as shown in FIG. 2M. As described above, the dielectric material 322 prevents the conductive feature 328 from forming between the neighboring portions of the conductive layer 312. For example, if the first opening is slightly misaligned with the portion of the conductive layer 312 due to EPE, the etch process to remove the portion of the etch stop layer 324 in the first opening does not substantially affect the dielectric material 322 due to different etch selectivity. As a result, the first portion 330 of the conductive feature 328 is not formed between neighboring portions of the conductive layer 312.

In some embodiments, the etch process to remove the portion of the etch stop layer 324 in the first opening also removes a portion of the dielectric material 322, and a portion of the first portion 330 of the conductive feature 328 may be formed in the dielectric material 322, as shown in FIG. 2N. Because the height H1 (FIG. 2G) of the dielectric material 322 is about 2 nm to about 10 nm greater than the height H2 (FIG. 2G) of the conductive layer 312, the portion of the first portion 330 of the conductive feature 328 is not formed between neighboring portions of the conductive layer 312 even if a portion of the dielectric material 322 is removed. In other words, the portion of the first portion 330 of the conductive feature 328 formed in the dielectric material 322 may have a height H3 less than about 10 nm, such as less than about 2 to about 10 nm, so the portion of the first portion 330 of the conductive feature 328 does not extend below the level of a top surface 329 of the portions of the conductive layer 312, as shown in FIG. 2N.

If a dielectric material, instead of the dielectric material 322, is disposed between neighboring portions of the conductive layer 312 and has the same height as the conductive layer 312, the first portion 330 of the conductive feature 328 may be formed between neighboring portions of the conductive layer 312, which may cause line to line leakage. Reliability issues such as poor breakdown voltage or time dependent dielectric breakdown may occur as a result of the line to line leakage. Furthermore, if the first portion 330 of the conductive feature 328 is formed between neighboring portions of the conductive layer 312, the resulting capacitance increases. This increased capacitance results in increased capacitive coupling between the portions of the conductive layer 312, increased power consumption, and an increase in the resistive-capacitive (RC) time constant. With the dielectric material 322 having the height H1 (FIG. 2G), the etch processes utilized to form the first opening do not substantially affect the dielectric material 322 due to the different etch selectivity compared to the dielectric material 326 and the etch stop layer 324. Thus, with the dielectric material 322, the risk of line to line leakage is reduced when EPE occurs.

Figure 2O:
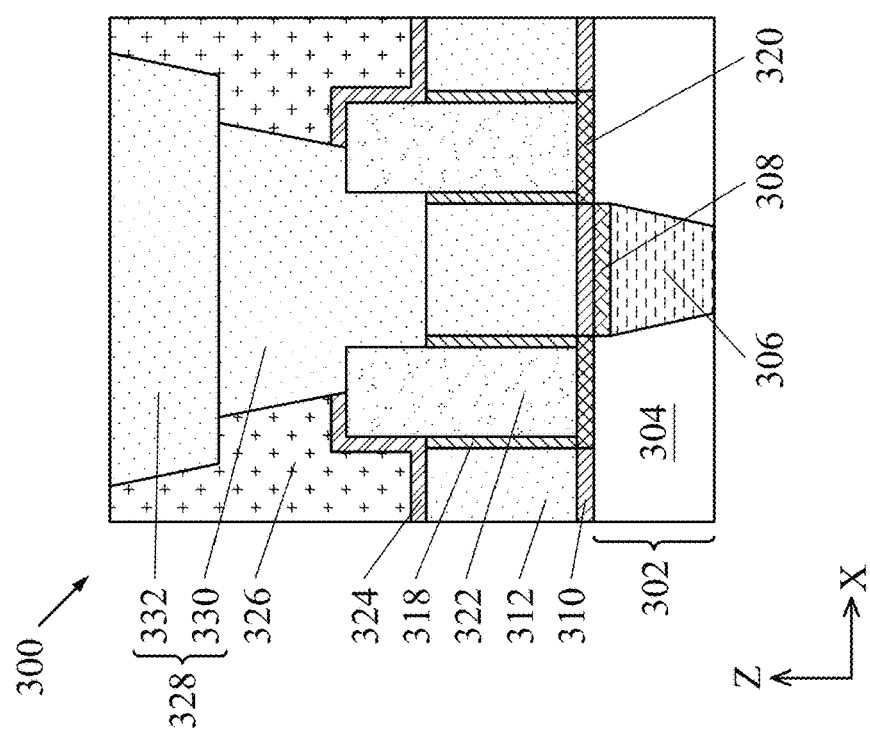

In some embodiments, as shown in FIG. 2O, the first opening in the dielectric material is large and exposes at least a portion of each of two neighboring dielectric materials 322. With the first opening having a dimension larger than the distance between neighboring dielectric materials 322, the first portion 330 of the conductive feature 328 is self-aligned with the portion of the conductive layer 312 and the contact resistance is reduced. For example, due to the first opening having the large dimension, the entire top surface of the corresponding portion of the conductive layer 312 may be exposed even with a slight misalignment between the first opening and the portion of the conductive layer 312. Because the dielectric material 322 is made of a material having different etch selectivity compared to the etch stop layer 324 and the dielectric material 326, the first portion 330 of the conductive feature 328 is not between neighboring dielectric materials 322.

In some embodiments, as shown in FIG. 2P, a portion of each dielectric material 322 of the two neighboring dielectric materials 322 is removed during the formation of the first opening in the dielectric material 326. As described above, because the height H1 (FIG. 2G) of the dielectric material 322 is about 2 nm to about 10 nm greater than the height H2 (FIG. 2G) of the conductive layer 312, the portion of the first portion 330 of the conductive feature 328 is not formed between neighboring portions of the conductive layer 312 even if a portion of the dielectric material 322 is removed. As shown in FIG. 2P, the first portion 330 of the conductive feature 328 may include a portion disposed in each of the two neighboring dielectric materials 322. Each portion of the first portion 330 of the conductive feature 328 formed in the dielectric material 322 has the height H3 that is less than about 10 nm, such as less than about 2 nm to about 10 nm. Thus, the portion of the first portion 330 of the conductive feature 328 does not extend below the level of a top surface 329 of the portions of the conductive layer 312, as shown in FIG. 2P.

Figure 3:
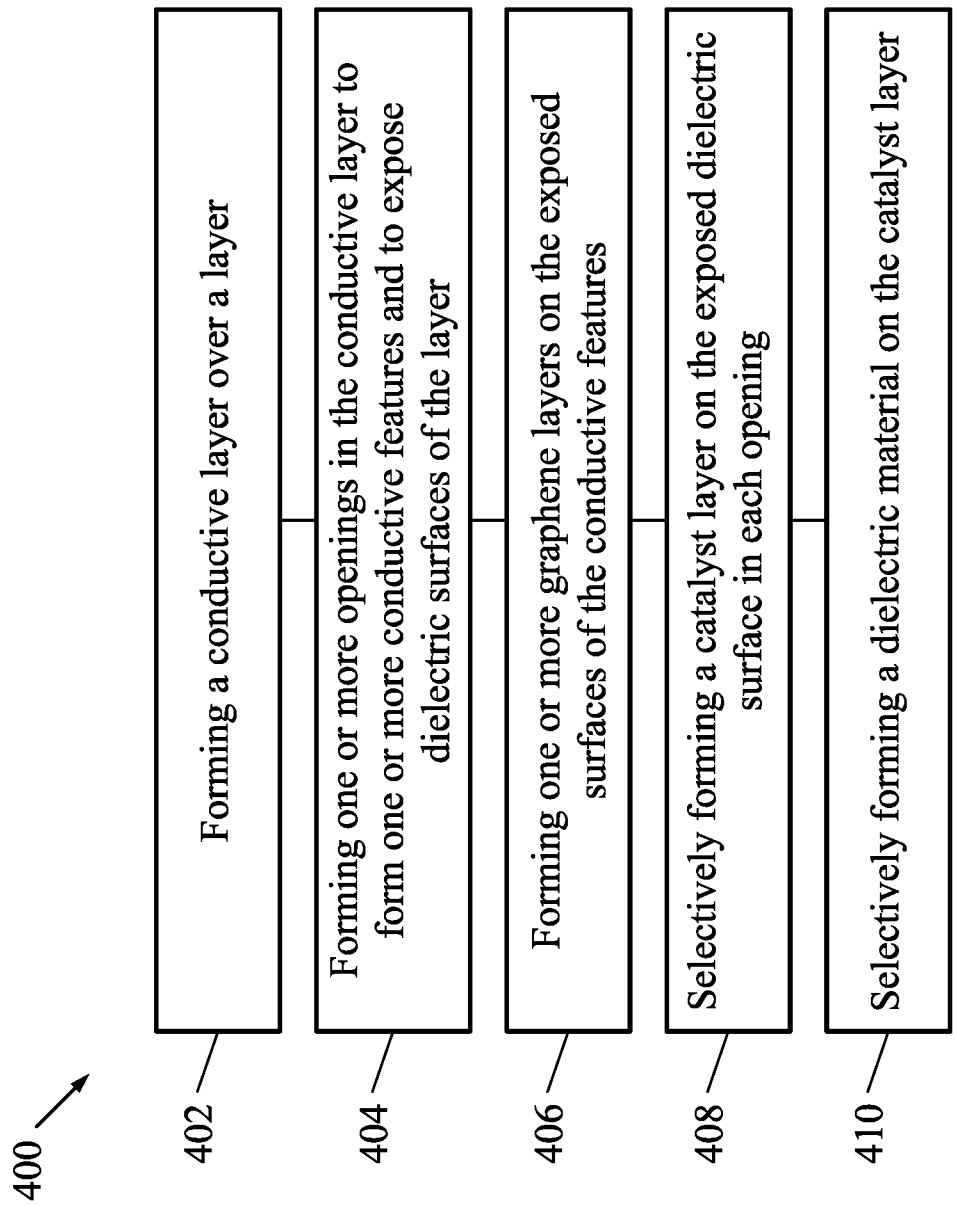
FIG. 3 is a flow chart showing a method of forming the interconnection structure, in accordance with some embodiments.

FIG. 3 is a flow chart showing a method 400 of forming the interconnection structure 300, in accordance with some embodiments. It is noted that the operations of the method 400, including any descriptions given with reference to the figures, are merely exemplary and are not intended to be limiting beyond what is specifically recited in the claims that follow. Additional operations may be implemented before, during, and after the method 400, and some operations may be replaced or eliminated in accordance with various embodiments of the method 400.

The method 400 starts at operation 402, which is forming a conductive layer over a layer. The conductive layer may be the conductive layer 312 (FIG. 2B), and the layer may be the layer 302 (FIG. 2B). The layer may be a dielectric layer (such as the dielectric layer 304) having one or more conductive features (such as the conductive features 306) formed therein. Next, at operation 404, one or more openings are formed in the conductive layer to form one or more conductive features and to expose dielectric surfaces of the layer. The one or more openings may be the one or more openings 316 (FIG. 2C), and the conductive features may be the portions of the conductive layer 312 (FIG. 2C). The dielectric surfaces of the layer may be the dielectric surfaces of the dielectric layer 304. Next, at operation 406, one or more graphene layers are formed on the exposed surfaces of the conductive features. The one or more graphene layers may be the one or more graphene layers 318 (FIG. 2E). Next, at operation 408, a catalyst layer is selectively formed on the exposed dielectric surface in each opening. The catalyst layer may be the catalyst layer 320 (FIG. 2F) that is selectively formed on the exposed portions of the dielectric layer 304 in each opening 316. Next, at operation 410, a dielectric material is selectively formed on the catalyst layer. The dielectric material may be the dielectric material 322. The dielectric material may have a height that is greater than a height of the conductive feature and may include a material that has a different etch selectivity compared to an etch stop layer (such as the etch stop layer 324) and a second dielectric material (such as the dielectric material 326) formed subsequently. The material and height of the dielectric material prevent a conductive feature (such as the conductive feature 328) from forming between the neighboring conductive features, leading to reduced line to line leakage when EPE occurs. The method 400 illustrates a process to form low resistivity, low capacitance, and self-aligned conductive features.

The present disclosure in various embodiments provides one or more graphene layers 318 covering the portions of the conductive layer 312, so the catalyst layers 320 are formed on the dielectric material of the dielectric layer 304. As a result, the dielectric materials 322 are selectively formed on the catalyst layers 320 but not on the one or more graphene layers 318. Each dielectric material 322 has a height greater than a height of the conductive layer 312. Some embodiments may achieve advantages. For example, the one or more graphene layers 318 cause the dielectric materials 322 to be selectively formed, which reduces the number of processes (i.e., a planarization process may be omitted as the result of selective deposition). Furthermore, the one or more graphene layers 318 formed on the portions of the conductive layer 312 lead to reduced sheet resistance. In addition, the dielectric materials 322 prevent a conductive feature 328 from forming between the neighboring portions of the conductive layer 312, leading to reduced line to line leakage when EPE occurs.

An embodiment is an interconnection structure. The structure includes a dielectric layer, a first conductive feature disposed in the dielectric layer, a second conductive feature disposed over the first conductive feature, a third conductive feature disposed adjacent the second conductive feature, a first dielectric material disposed between the second and third conductive features, a first one or more graphene layers disposed between the second conductive feature and the first dielectric material, and a second one or more graphene layers disposed between the third conductive feature and the first dielectric material.

Another embodiment is a structure. The structure includes one or more devices and an interconnection structure disposed over the one or more devices. The interconnection structure includes a dielectric layer, a first conductive feature disposed in the dielectric layer, a second conductive feature disposed over the first conductive feature, and the second conductive feature has a first height. The interconnection structure further includes a third conductive feature disposed adjacent the second conductive feature and has the first height and a first dielectric material disposed between the second and third conductive feature. The first dielectric material has a second height greater than the first height.

A further embodiment is a method. The method includes forming a conductive layer over a layer, forming one or more openings in the conductive layer to form one or more conductive features and to expose portions of the layer, forming one or more graphene layers on exposed surfaces of the one or more conductive features, and selectively forming a first dielectric material over the exposed surfaces of the layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An interconnection structure, comprising:
a dielectric layer;
a first conductive feature disposed in the dielectric layer;
a second conductive feature disposed over the first conductive feature, wherein the second conductive feature has a first height;
a third conductive feature disposed adjacent the second conductive feature;
a first dielectric material disposed between the second and third conductive features, wherein the first dielectric material has a second height greater than the first height;
a first one or more graphene layers disposed between the second conductive feature and the first dielectric material;
a second one or more graphene layers disposed between the third conductive feature and the first dielectric material;
an etch stop layer disposed on the first dielectric material;
a second dielectric material disposed on the etch stop layer; and
a fourth conductive feature disposed in the second dielectric material, wherein the fourth conductive feature is disposed over the second conductive feature and adjacent the first dielectric material.

2. The interconnection structure of claim 1, wherein the first one or more graphene layers and the second one or more graphene layers each include 1 to 10 layers of graphene.

3. The interconnection structure of claim 2, further comprising a glue layer disposed between the first conductive feature and the second conductive feature.

4. The interconnection structure of claim 3, further comprising a cap layer disposed between the glue layer and the first conductive feature.

5. The interconnection structure of claim 4, a wherein the second dielectric material is disposed over the first dielectric material and the third conductive feature.

6. The interconnection structure of claim 5, wherein the fourth conductive feature is electrically connected to the second conductive feature.

7. The interconnection structure of claim 6, wherein the fourth conductive feature is partially disposed over the first dielectric material.

8. The interconnection structure of claim 1, further comprising a third dielectric material disposed adjacent the second conductive feature, wherein the second conductive feature is disposed between the first dielectric material and the third dielectric material.

9. The interconnection structure of claim 8, wherein the fourth conductive feature is disposed between the first material and the third dielectric material.

10. The interconnection structure of claim 8, wherein the fourth conductive feature is in contact with the etch stop layer, the first dielectric material, and the third dielectric material.

11. The interconnection structure of claim 8, wherein the fourth conductive feature is partially disposed in the first dielectric material.

12. The interconnection structure of claim 11, wherein the fourth conductive feature is partially disposed in the third dielectric material.

13. The interconnection structure of claim 1, wherein the first one or more graphene layers are disposed on the second conductive feature.

14. A structure, comprising:
one or more devices; and
an interconnection structure disposed over the one or more devices, wherein the interconnection structure comprises:
a dielectric layer;
a first conductive feature disposed in the dielectric layer;
a second conductive feature disposed over the first conductive feature, wherein the second conductive feature has a first height;
a third conductive feature disposed adjacent the second conductive feature, wherein the third conductive feature has the first height;
a first dielectric material disposed between the second and third conductive features, wherein the first dielectric material has a second height greater than the first height;
a first one or more graphene layers disposed between the second conductive feature and the first dielectric material;
a second one or more graphene layers disposed between the third conductive feature and the first dielectric material;
a second dielectric material disposed adjacent the second conductive feature wherein the second conductive feature is disposed between the first dielectric material and the second dielectric material;

a third dielectric material disposed over the third conductive feature and at least partially over the first and second dielectric materials; and a fourth conductive feature disposed in the third dielectric material, wherein the fourth conductive feature is disposed over the second conductive feature, the fourth conductive feature comprises a first portion disposed in the first dielectric material, wherein the first portion of the fourth conductive feature is disposed above a level of a top surface of the second conductive feature.

15. The structure of claim 14, wherein the fourth conductive feature is partially disposed over the first dielectric material and the second dielectric material.

16. The structure of claim 14, wherein a second portion of the fourth conductive feature is disposed in the second dielectric material, wherein the second portion of the fourth conductive feature is disposed above the level of the top surface of the second conductive feature.

17. The structure of claim 14, wherein the one or more devices comprise one or more transistors, each transistor comprises a source/drain epitaxial feature, and the first conductive feature is electrically connected to the source/drain epitaxial feature.

18. A method, comprising:
forming a conductive layer over a layer;
forming one or more openings in the conductive layer to form one or more conductive features and to expose portions of the layer;
forming one or more graphene layers on exposed surfaces of the one or more conductive features;
selectively forming a first dielectric material over the exposed portions of the layer;
selectively forming a catalyst layer on the exposed portions of the layer, wherein the first dielectric material is selectively formed on the catalyst layer; and
removing a portion of the one or more graphene layers disposed on horizontal surfaces of the one or more conductive features after forming the first dielectric material.

19. The method of claim 18, further comprising:
forming an etch stop layer over the first dielectric material and the one or more conductive features; and
forming a second dielectric material on the etch stop layer.

20. The method of claim 19, further comprising forming a conductive feature in the second dielectric material, wherein the conductive feature is formed over one of the one or more conductive features and over at least a portion of the first dielectric material.

* * * * *